United States Patent [19]

Ikuta

[11] Patent Number: 5,455,682
[45] Date of Patent: Oct. 3, 1995

[54] METHOD OF AND APPARATUS FOR RECORDING HALFTONE IMAGES

[75] Inventor: Kunio Ikuta, Kyoto, Japan

[73] Assignee: Dainippon Screen Mfg. Co., Ltd., Kyoto, Japan

[21] Appl. No.: 92,091

[22] Filed: Jul. 16, 1993

[30] Foreign Application Priority Data

Jul. 23, 1992 [JP] Japan .................................. 4-218643

[51] Int. Cl.⁶ ..................................................... H04N 1/21
[52] U.S. Cl. ......................... 358/298; 358/458; 347/251
[58] Field of Search ........................ 358/298, 459, 358/460, 536, 455, 456, 458; 347/251, 131

[56] References Cited

U.S. PATENT DOCUMENTS 4,673,971  6/1987  Ikuta et al. .
4,977,464 12/1990  Ikuta ........................... 358/448
5,055,923 10/1991  Kitagawa et al. .
5,299,020  3/1994  Carlebach ................... 358/298

FOREIGN PATENT DOCUMENTS 52-49361  12/1977  Japan .
61-137473  6/1986  Japan .
3-101568   4/1991  Japan .

*Primary Examiner*—Mark J. Reinhart
*Attorney, Agent, or Firm*—Lowe, Price, LeBlanc & Becker

[57] ABSTRACT

The present invention produces a set of improved halftone images which effectively prevents occurrence of rosette moire. A plurality of parallelograms can be formed from three apexes consisting of an arbitrary first apex of a reference triangle RT1, a middle point of the side of the triangle facing to the first apex, and one of the other two apexes of the triangle. One of the parallelograms is selected as a unit area for one halftone dot. The unit area is virtually laid out repeatedly on an image plane, and one halftone dot is located with respect to each unit area. Each halftone dot can be located at the center of the unit area or at any desirable position in the unit area.

17 Claims, 16 Drawing Sheets

CYAN

MAGENTA

BLACK

YELLOW

METHOD OF AND APPARATUS FOR RECORDING HALFTONE IMAGES

BACKGROUND OF THE INVENTION

1. Field of the Invention

The present invention relates to a method and an apparatus for recording halftone images, and more specifically to a technique to effectively prevent rosette moire.

2. Description of the Related Art

In prepress process of color printing, an original color image is separated into four color separation images of four primary colors, and a set of the color separation images are recorded on photosensitive films as halftone images. Color printing plates for the respective colors are then produced from the set of halftone image films. The halftone images of the primary colors are printed on a printing sheet one after another to make a color print.

If all of the four halftone images which represent a color image have the same halftone dot structure, registering mismatch between some of the halftone images on a printing sheet often causes undesirable visual color shift in a resulting printed matter. In order to prevent the undesirable color shift, a set of halftone images are generally produced to have different screen angles, for example, 0, 15, 45, and 75 degrees for four primary colors, respectively. The screen angle is an angle between a scanning line and a grid line drawn through halftone dot centers.

If a set of halftone images which have different screen angles are printed on a printing sheet, however, the difference in the screen angle often causes circular patterns, or "rosette moire", appearing at regular intervals. FIG. 18 shows an example of "rosette moire". Halftone dots of three primary colors of magenta (M), cyan (C), and black (K) are represented by solid squares, open circles, and solid circles, respectively. As shown in FIG. 18, a circular pattern consisting of plural halftone dots of the three colors is formed around a meeting point MP of the three halftone dots of respective colors. With naked eyes, many circular patterns having a pitch Prm of the meeting points MP are observed on a printed image. Generally, the pitch Prm of the rosette moire is greater than a pitch of halftone dots; in FIG. 18, Prm is approximately 2.2 times a pitch Pc of cyan halftone dots. The greater the pitch Prm of rosette moire, the more conspicuous the rosette moire becomes to naked eyes. The rosette moire is often observed over a wide range on a printing image, thereby deteriorating the quality of the printing image.

SUMMARY OF THE INVENTION

An object of the present invention is to provide an improved method and an improved apparatus for recording halftone images which effectively prevents rosette moire.

The present invention is directed to a method of recording a plurality of color separation images of a color image as halftone images, the method comprising the steps of: (a) presetting a reference triangle having a first apex, a second apex, a third apex, a first side facing to the first apex, a second side facing to the second apex, and a third side facing to the third apex; (b) producing a first halftone image with the steps of: (b-1) selecting a first parallelogram out of a first set of a plurality of parallelograms which are formed from three apexes consisting of the first apex, a first middle point of the first side, and one of the second and third apexes; (b-2) virtually laying out the first parallelogram as a first unit area repeatedly over a first image plane; and (b-3) locating one halftone dot with respect to each the first unit area; (c) producing a second halftone image with the steps of: (c-1) selecting a second parallelogram out of a second set of a plurality of parallelograms which are formed from three apexes consisting of the second apex, a second middle point of the second side, and one of the first and third apexes; (c-2) virtually laying out the second parallelogram as a second unit area repeatedly over a second image plane; and (c-3) locating one halftone dot with respect to each the second unit area; and (d) producing a third halftone image with the steps of: (d-1) selecting a third parallelogram out of a third set of a plurality of parallelograms which are formed from three apexes consisting of the third apex, a third middle point of the third side, and one of the first and second apexes; (d-2) virtually laying out the third parallelogram as a third unit area repeatedly over a third image plane; and (d-3) locating one halftone dot with respect to each the third unit area.

Preferably, the step (b-1) includes the step of selecting the first parallelogram whose angles are closest to a right angle among the first set of the plurality of parallelograms; the step (c-1) includes the step of selecting the second parallelogram whose angles are closest to a right angle among the second set of the plurality of parallelograms; and the step (d-1) includes the step of selecting the third parallelogram whose angles are closest to a right angle among the third set of the plurality of parallelograms.

In the preferred embodiment, the step (b-3) includes the step of locating halftone dots at the first through third apexes and the first middle point; the step (c-3) includes the step of locating halftone dots at the first through third apexes and the second middle point; the step (d-3) includes the step of locating halftone dots at the first through third apexes and the third middle point.

More preferably, the reference triangle has three angles of substantially 60 degrees.

In the preferred embodiment, the first through third halftone images are those for magenta, cyan, and black inks, respectively.

The present invention is also directed to an apparatus of recording a plurality of color separation images for a plurality of colors as halftone images, comprising: (a) image capturing means for capturing a plurality of color separation image signals representing a color image for at least three colors, respectively; (b) a mount for mounting photosensitive material, on which a plurality of halftone images are to be recorded; (c) a screen pattern memory for storing three sets of threshold values for the respective three colors, the three sets of threshold values being arranged in first through third unit areas, respectively, each of the first through third unit areas being laid out repeatedly in first through third X-Y coordinate systems, respectively, each of the first through third unit areas being defined by: (c-1) presetting a reference triangle having a first apex, a second apex, a third apex, a first side facing to the first apex, a second side facing to the second apex, and a third side facing to the third apex; (c-2) selecting a first parallelogram as the first unit area out of a first set of a plurality of parallelograms which are formed from three apexes consisting of the first apex, a first middle point of the first side, and one of the second and third apexes, the sides of the first parallelogram being parallel to the coordinate axes of the first X-Y coordinate system; (c-3) selecting a second parallelogram as the second unit area out of a second set of a plurality of parallelograms which are formed from three apexes consisting of the second apex, a second middle point of the second side, and one of the first and third apexes, the sides of the second parallelogram being parallel to the coordinate axes of the second X-Y coordinate system; and (c-4) selecting a third parallelogram as the third unit area out of a third set of a plurality of parallelograms which are formed from three apexes consisting of the third apex, a third middle point of the third side, and one of the first and second apexes, the sides of the third parallelogram being parallel to the coordinate axes of the third X-Y coordinate system; (d) coordinate signal generation means for generating a coordinate signal representing a position in a Cartesian U-V coordinate system, the U and V denoting a primary scanning direction and a secondary scanning direction on the mount, respectively, the U-V coordinate system being set in predetermined relations to the first through third X-Y coordinate systems; (e) address generation means for transforming the coordinate signal from U-V coordinates into first through third X-Y coordinates to generate address for the screen pattern memory; (f) comparator means for comparing each of the plurality of color separation image signals with a target threshold value read out from each of the three sets of threshold values stored in the screen pattern memory as a function of the first through third X-Y coordinates, to thereby generate a plurality of exposure signals for the respective three colors, the plurality of exposure signals indicating whether or not to expose target recording pixels on the photosensitive material; and (g) exposure means for exposing the photosensitive material mounted on the drum responsive to each of the plurality of exposure signals, thereby recording the plurality of color separation images for the three colors as halftone images.

According to another aspect of the present invention, the screen pattern memory memorizes three sets of threshold values for the respective three colors, the three sets of threshold values being arranged in first through third block areas, respectively, the first through third block areas including a plurality of first unit areas, a plurality of second unit areas, and a plurality of third unit areas, respectively, each of the first through third block areas being laid out repeatedly in an X-Y coordinate system.

These and other objects, features, aspects, and advantages of the present invention will become more apparent from the following detailed description of the preferred embodiment with the accompanying drawings.

DESCRIPTION OF THE PREFERRED EMBODIMENT

A. Fundamental Arrangement of Halftone Dots

Figure 1A:
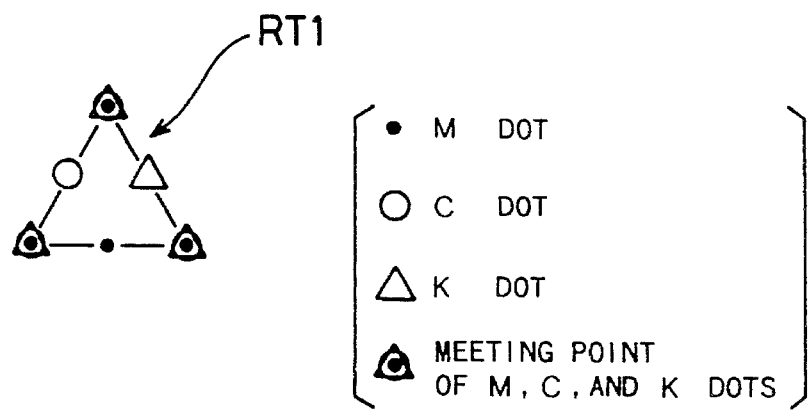
FIGS. 1A and 1B show a fundamental arrangement of halftone dots according to a first embodiment of the present invention.
Figure 1B:
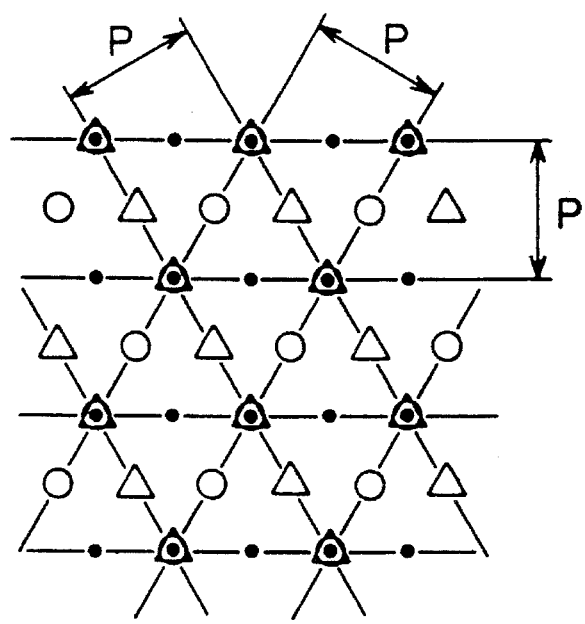

FIGS. 1A and 1B show a fundamental arrangement of halftone dots according to a first embodiment of the present invention. FIG. 1A shows a reference triangle RT1 used as a unit of the halftone dot arrangement. The reference triangle RT1 is an equilateral triangle having three apexes at meeting points of halftone dots of three different colors, that is, magenta (M), cyan (C), and black (K). Each of the M, C, and K dots is also positioned at the middle point of one side of the reference triangle RT1.

In this specification, it is assumed that halftone images for the four primary colors of M, C, K, and Y(yellow) are produced. However, the dot arrangement of M, C, and K plates is mainly described here because the halftone image of the Y plate has little effect on rosette moire. The dot arrangement of the Y plate therefore can be determined arbitrarily.

FIG. 1B shows a dot arrangement formed by repeating the reference triangle RT1 of FIG. 1A over an image plane. As clearly seen in FIG. 1B, the meeting points of the three halftone dots become centers of repeated patterns, and the pitch of the repeated pattern is equal to a pitch P of the halftone dots. The relatively small pitch of the repeated pattern makes the pattern inconspicuous to the naked eyes.

Figure 2A:
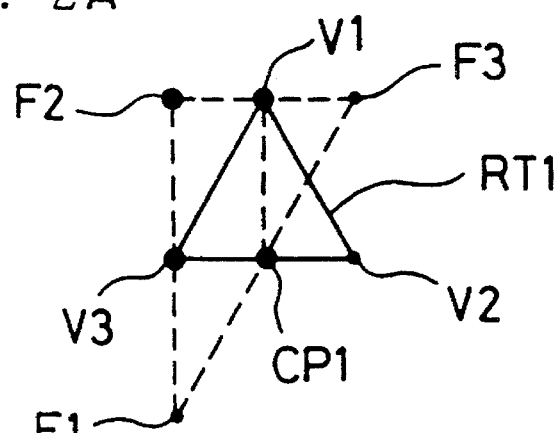
FIGS. 2A through 2E show an arrangement of magenta halftone dots in the first embodiment.
Figure 2B:
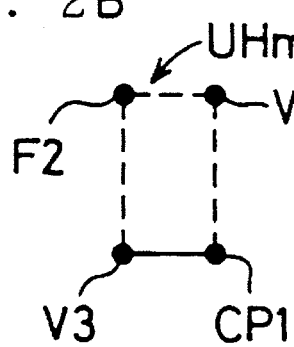
Figure 2C:
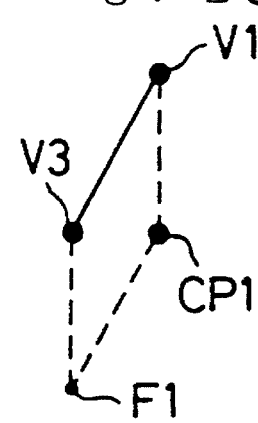
Figure 2D:
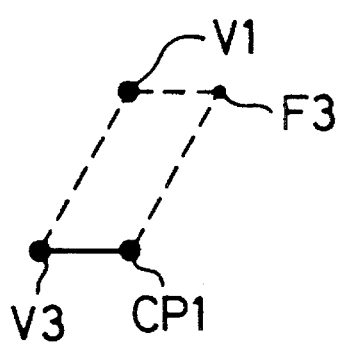
Figure 2E:
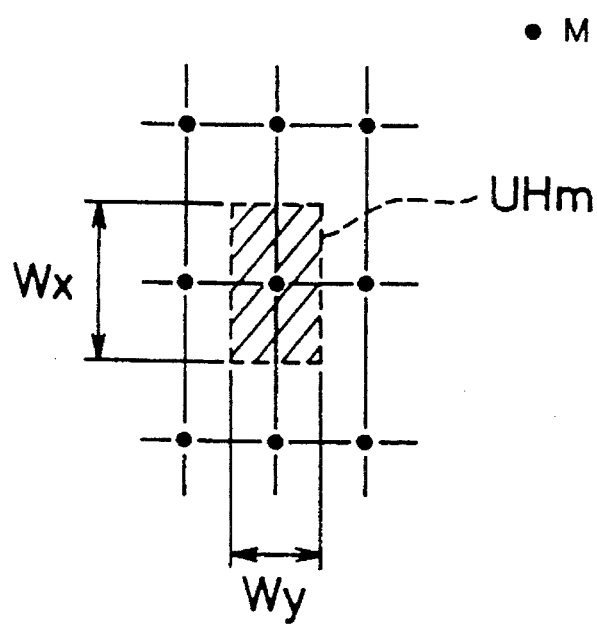

FIGS. 2A through 2E show an arrangement of magenta halftone dots corresponding to the dot arrangement shown in FIG. 1B. FIG. 2A shows a plurality of parallelograms which can be formed from three apexes consisting of an apex V1 of the reference triangle RT1, a middle point CP1 of a side of the triangle facing to the apex V1, and another apex V3 selected from the other apexes V2 and V3 of the triangle. The ocher apexes of the three parallelograms are points F1, F2, and F3, respectively. FIGS. 2B, 2C, and 2D respectively show three parallelograms thus formed. Magenta dots are located at apexes of a repeated arrangement of one of the three parallelograms in an image plane. FIG. 2E is a plan view showing an exemplified arrangement of magenta halftone dots formed by repeating the parallelogram shown in FIG. 2B, which is a rectangle. A unit halftone dot area UHm for magenta dots is shaded in FIG. 2E. The unit halftone dot area is an area in which one halftone dot exists. In other words, the unit halftone dot area has a shape of one halftone dot when the halftone dot area rate is 100%, and the number of painted pixels in each unit halftone dot area corresponds to a halftone dot area rate ranging from 0 to 100%.

Although the halftone dot arrangement of FIG. 2E can be obtained by repeating any one of the three parallelograms and parallelograms formed by inverting the three parallelograms, the shape of the unit halftone dot area UHm is different for these parallelogram. Since a square is most preferable as a shape of the unit halftone dot area, the rectangle of FIG. 2B which is closest to a square is selected as the unit halftone dot area UHm. The 'parallelogram closest to a square' is a parallelogram whose four angles are nearest to a right angle. The unit halftone dot area of a square-like shape allows the dots to be arranged at square-like positions, thus reducing a so-called dot gain. The dot gain is an increase rate of halftone dot areas on printed matter from those on a halftone image films or on a printing plate. Since a greater dot gain is not good for reproducibility of image, a parallelogram closest to a square is preferable as a unit halftone dot area.

Figure 3A:
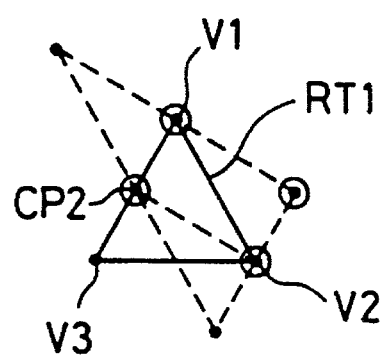
FIGS. 3A and 3B show an arrangement of cyan halftone dots in the first embodiment.
Figure 3B:
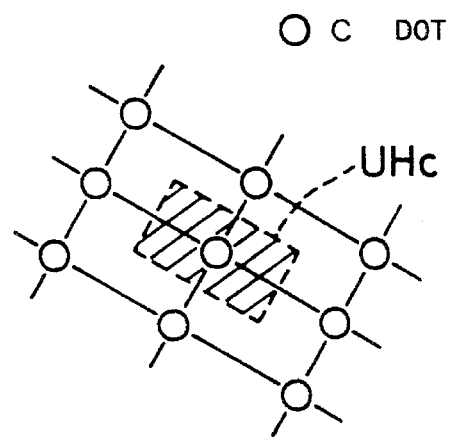

FIGS. 3A and 3B show an arrangement of cyan halftone dots corresponding to the dot arrangement of FIG. 1B. FIG. 3A shows a plurality of parallelograms which can be formed from three apexes consisting of an apex V2 of the reference triangle RT1, a middle point CP2 of a side of the triangle facing to the apex V2, and another apex V1 selected from the other apexes V1 and V3 of the triangle. FIG. 3B is a plan view showing an exemplified arrangement of cyan halftone dots formed by repeating one of the parallelograms, where a unit halftone dot area UHc is shaded.

Figure 4A:
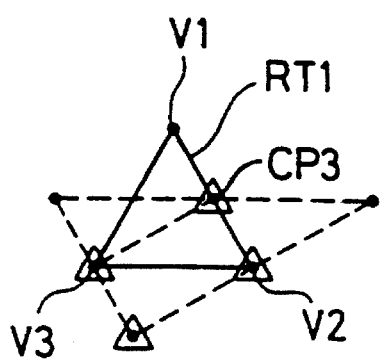
FIGS. 4A and 4B show an arrangement of black halftone dots in the first embodiment.
Figure 4B:
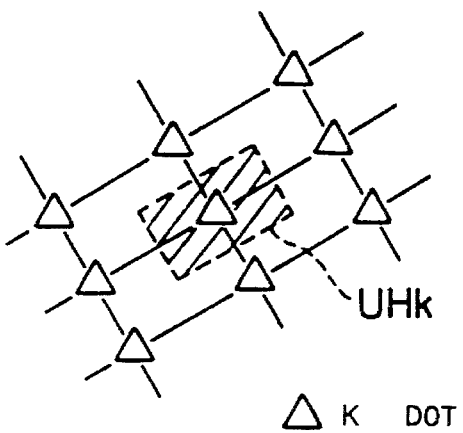

FIGS. 4A and 4B show an arrangement of black halftone dots corresponding to the dot arrangement of FIG. 1B. FIG. 4A shows a plurality of parallelograms which can be formed from three apexes consisting of an apex V3 of the reference triangle RT1, a middle point CP3 of a side of the triangle facing to the apex V3, and another apex V2 selected from the other apexes V1 and V2 of the triangle. FIG. 4B is a plan view showing an exemplified arrangement of black halftone dots formed by repeating one of the parallelogram, where a unit halftone dot area UHk is shaded.

As clearly shown in FIGS. 2E, 3B, and 4B, the unit halftone dot areas UHm, UHc, and UHk of the three color plates, M, C, and K are congruent with each other in the first embodiment.

If the unit halftone dot area is a rectangle, a screen ruling along its longer side is different from that along a shorter side. Although the screen ruling is not uniformly defined in this case, the size of the unit halftone dot area can be used as an index representing a substantial screen ruling. In this embodiment, since the unit halftone dot areas of the three color plates are congruent with one another, the substantial screen rulings thereof are equal to one another.

In general, If each unit halftone dot area of a plurality of color plates is selected from the parallelograms which can be formed from three apexes consisting of an arbitrary apex of a reference triangle, a middle point of a side of the triangle facing to the arbitrary apex, and one of the other apexes of the reference triangle, the unit halftone dot areas of the plurality of color plates always have an equal size.

Figure 18:
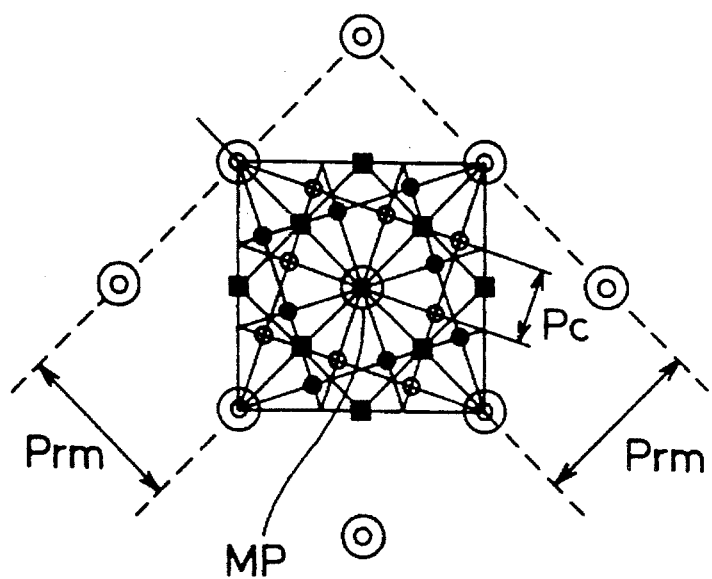
FIG. 18 shows a typical example of rosette moire.

Suppose that the size of the unit halftone dot area in the first embodiment is assumed to be equal to the size of the unit halftone dot area of the cyan dots shown in FIG. 18. The pitch P of the repeated pattern in FIG. 1B is approximately 0.6 times ($=1/\sqrt{3}$) the pitch Prm of the rosette moire in FIG. 18, and a spatial frequency of the repeated pattern in FIG. 1B is approximately 1.7 times ($=1/0.6$) that of the rosette moire in FIG. 18. The smaller pitch P of the repeated pattern in FIG. 1B makes the repeated pattern inconspicuous to the naked eyes.

Figures 1, 15A:
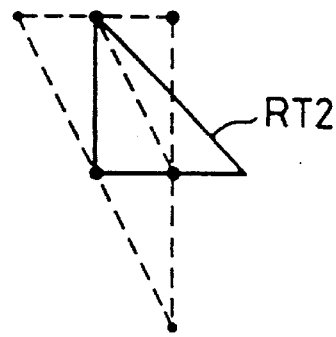
FIGS. 15A-1 through 15C-2 respectively show parallelograms and a unit halftone dot area of a halftone dot arrangement in each color printing plate, M, C, or K.

Although three dots of respective colors are positioned exactly at the respective three apexes of the reference triangle RT1 in the embodiment of FIG. 1, misalignment of printing plates may shift the relative position of these dots. Even in such a case, the pitch of a repeated pattern formed on a printed image is equal to the pitch P in FIG. 1B, thereby effectively preventing rosette moire. The same effect is expected even if the relative position of halftone dots for different color plates is shifted on purpose from that shown in FIG. 1B.

In the first embodiment shown in FIGS. 1A through 4B, one parallelogram is selected as a unit halftone dot area out of a plurality of parallelograms which can be formed from three apexes consisting of an arbitrary apex of the reference triangle RT1, a middle point of a side of the reference triangle facing to the arbitrary apex, and one of the other apexes of the reference triangle RT1. The unit halftone dot area is repeated over an image plane, and a dot is located in each unit halftone dot area. The dot in each unit halftone dot area can be located at the center of the unit halftone dot area or at any desirable position therein.

B. Screen Pattern Data

Figure 5A:
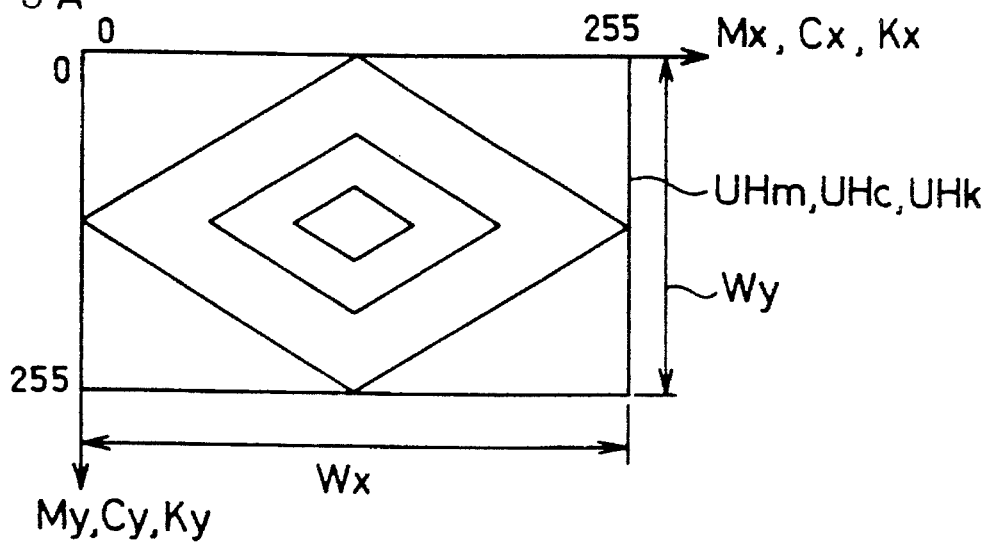
FIGS. 5A through 5C respectively show distributions of screen pattern data corresponding to halftone dots of the color printing plates.
Figure 5B:
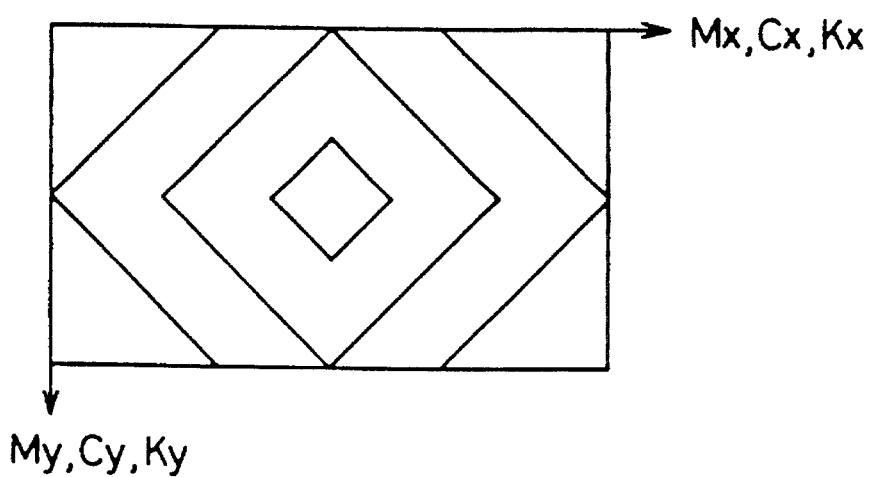
Figure 5C:
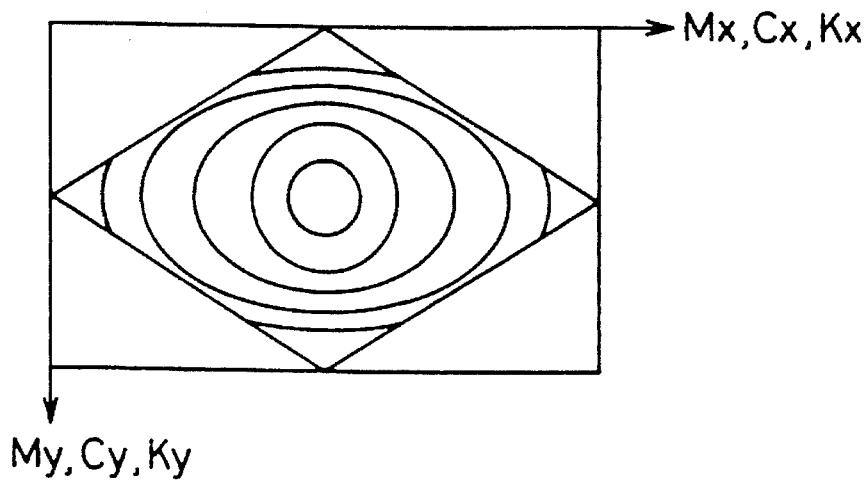

FIGS. 5A through 5C show contour lines representing the distributions of screen pattern data corresponding to halftone dots of the three color plates M, C, and K. Screen pattern data is a set of threshold values to be compared with an image signal. A dot signal or ON/OFF signal for each recording pixel is generated based on the results of the comparison. Since the unit halftone dot areas UHm, UHc, and UHK of the M, C, and K halftone plates are congruent with one another in shape, common screen pattern data can be used for all the three printing plates. For example, the pattern of FIG. 5A can be used as screen pattern data for all the M, C, and K plates.

In the pattern of FIG. 5A, a halftone dot is generated in a shape of a rhombus similar to that inscribed in the unit halftone dot area. The circumference of the rhombus dot is slightly longer than that of a square dot. Since the dot gain is positively correlated to the ratio of the circumference of the dot to the dot area, the dot gain in the pattern of FIG. 5A is slightly greater than that in a square dot pattern.

In the pattern of FIG. 5B, a halftone dot is generated in a shape of a square having preferable dot gain. In the pattern of FIG. 5C, the shape of a dot is close to a circle in an image region having a lower dot percent and gradually changed to a rhombus with increase in the dot percent. The dot gain for the pattern of FIG. 5C is smaller than that for the pattern of FIG. 5A because the circumference of the dot is shorter.

In the pattern of FIG. 5A, although a width Wx of the unit halftone dot area along the x-axis or in a secondary scanning direction is different from a width Wy along the y-axis or in a primary scanning direction, the widths Wx and Wy are divided by the same number. In other words, the address for a screen pattern memory, which stores screen pattern, ranges from 0 to 255 in both scanning directions.

Figure 6:
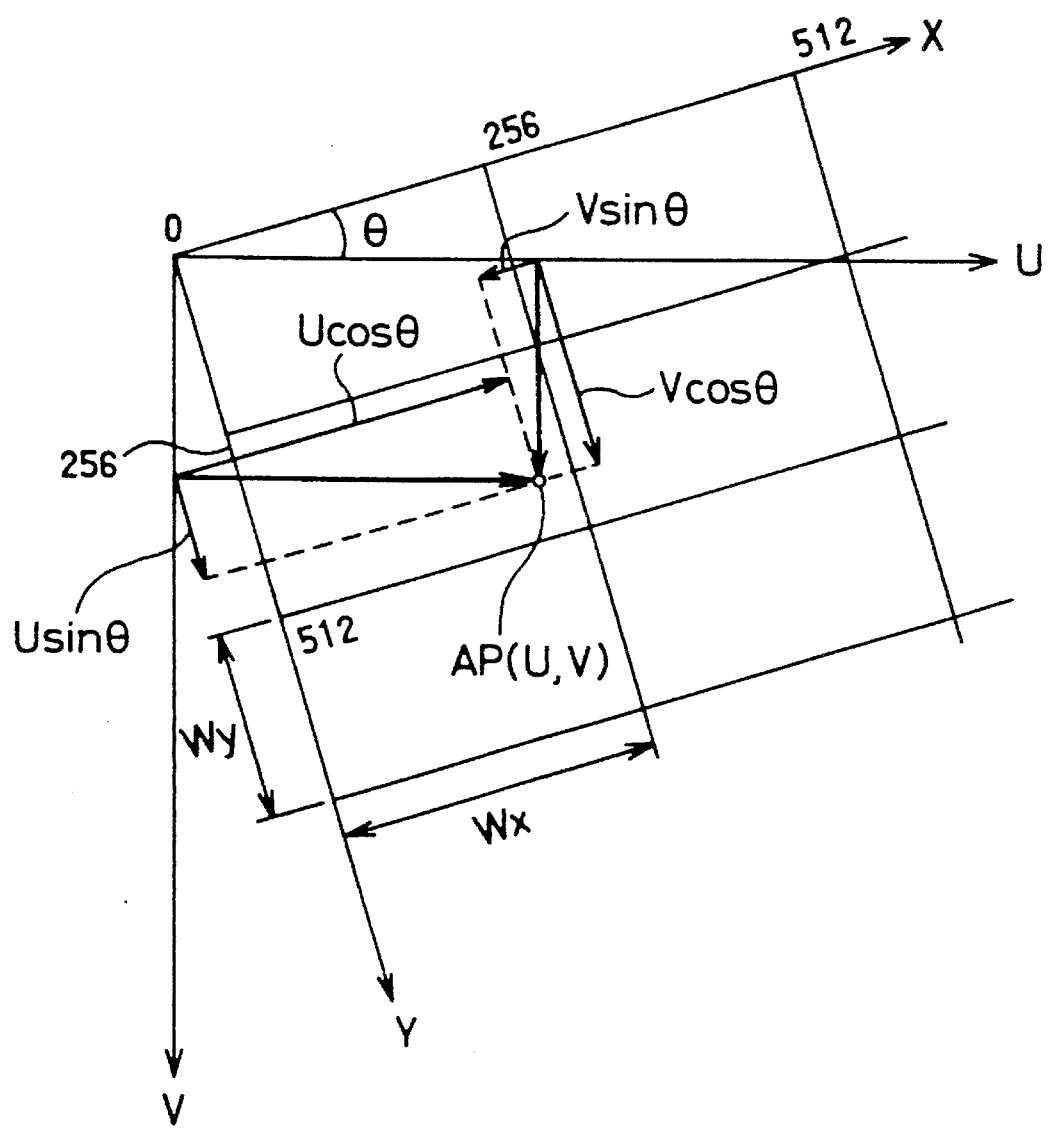
FIG. 6 shows the relationship between a scanning coordinate system U-V and a screen pattern coordinate system X-Y.

In recording a halftone image on a photosensitive film, a scanning coordinates system defined on the photosensitive film is converted to a coordinates system of screen pattern data (hereinafter referred to as screen pattern coordinates system) according to the following method. FIG. 6 shows the relationship between a scanning coordinates system U-V and a screen pattern coordinates system X-Y. In an image recording process, scanning coordinates (U, V) are converted to screen pattern coordinates (X, Y), and the screen pattern data stored at the address corresponding to the coordinates (X, Y) is read out of the screen pattern memory. The coordinates conversion is executed by:

$$X = (U \cos \theta - V \sin \theta) Pr/(Wx/256) \quad (1)$$

$$Y = (U \sin \theta + V \cos \theta) Pr/(Wy/256) \quad (2)$$

where Pr represents a side length of a recording pixel, and each unit halftone dot area is assumed to be divided into 256×256 sub-areas.

The procedure of performing the above coordinate transformation and reading out the screen pattern data with the transformed coordinates from the screen pattern memory is applied to an image recording method called Irrational Tangent Method. In the Irrational Tangent Method, a tangent of a screen angle $\theta$ (tan $\theta$) is set to be an irrational number. Since one screen pattern, or the pattern of threshold values, is repeatedly applied to each unit halftone dot area in the Irrational Tangent method, the screen pattern memory stores the screen pattern data for only one unit halftone dot area. The address ($X_M$, $Y_M$) in the screen pattern memory corresponding to the scanning coordinates (U, V) is given as follows:

$$X_M = \mathrm{mod}(X, 256) \quad (3)$$

$$Y_M = \mathrm{mod}(Y, 256) \quad (4)$$

where the operator "mod(A, B)" indicates the remainder of the division of A by B.

The method of reading screen pattern data out of the screen pattern memory in the Irrational Tangent Method is described in detail in U.S. Pat. No. 4,673,971, the disclosure of which is herein incorporated by reference.

Figure 7:
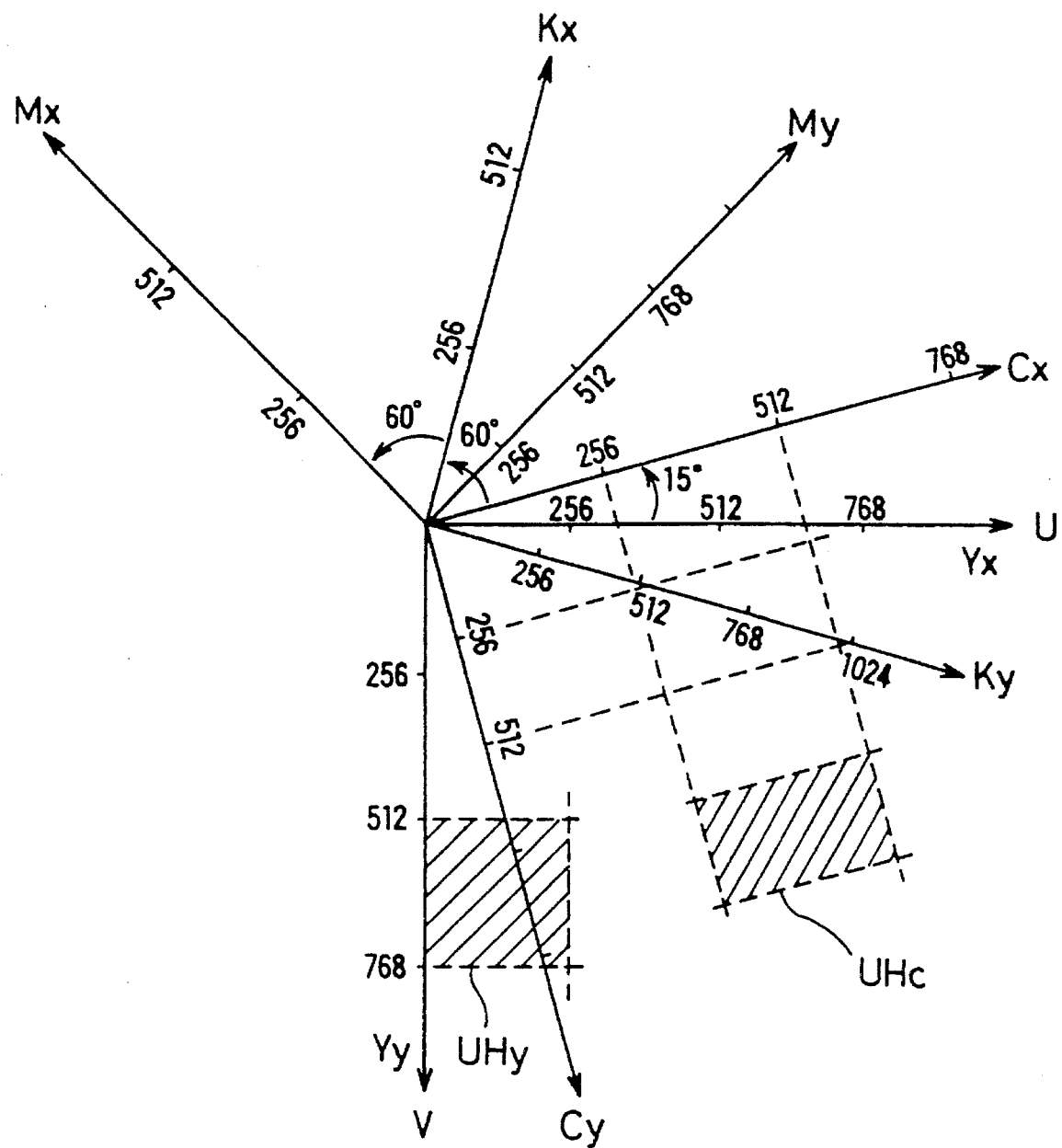
FIG. 7 is a plain view showing directions of coordinate axes of the screen pattern coordinate system in four color printing plates when different screen angles are allocated to the four color printing plates.

FIG. 7 is a plain view showing the coordinate axes of the screen pattern coordinates system for each color printing plate, Y, M, C, and K, which are allocated with different screen angles. In the case that the reference triangle RM is an equilateral triangle, the coordinates axes of the color plates M, C, and K are positioned in directions different from one another by 60 degrees, so that the screen angles of the color plates M, C, and K are different from one another by 60 degrees. Since the halftone image of the Y plate hardly contributes to occurrence of rosette moire, the screen angle is set equal to zero degree. The unit halftone dot area UHy of the Y plate is a square.

C. Structure and Operation of Image Recording Apparatus

Figure 8:
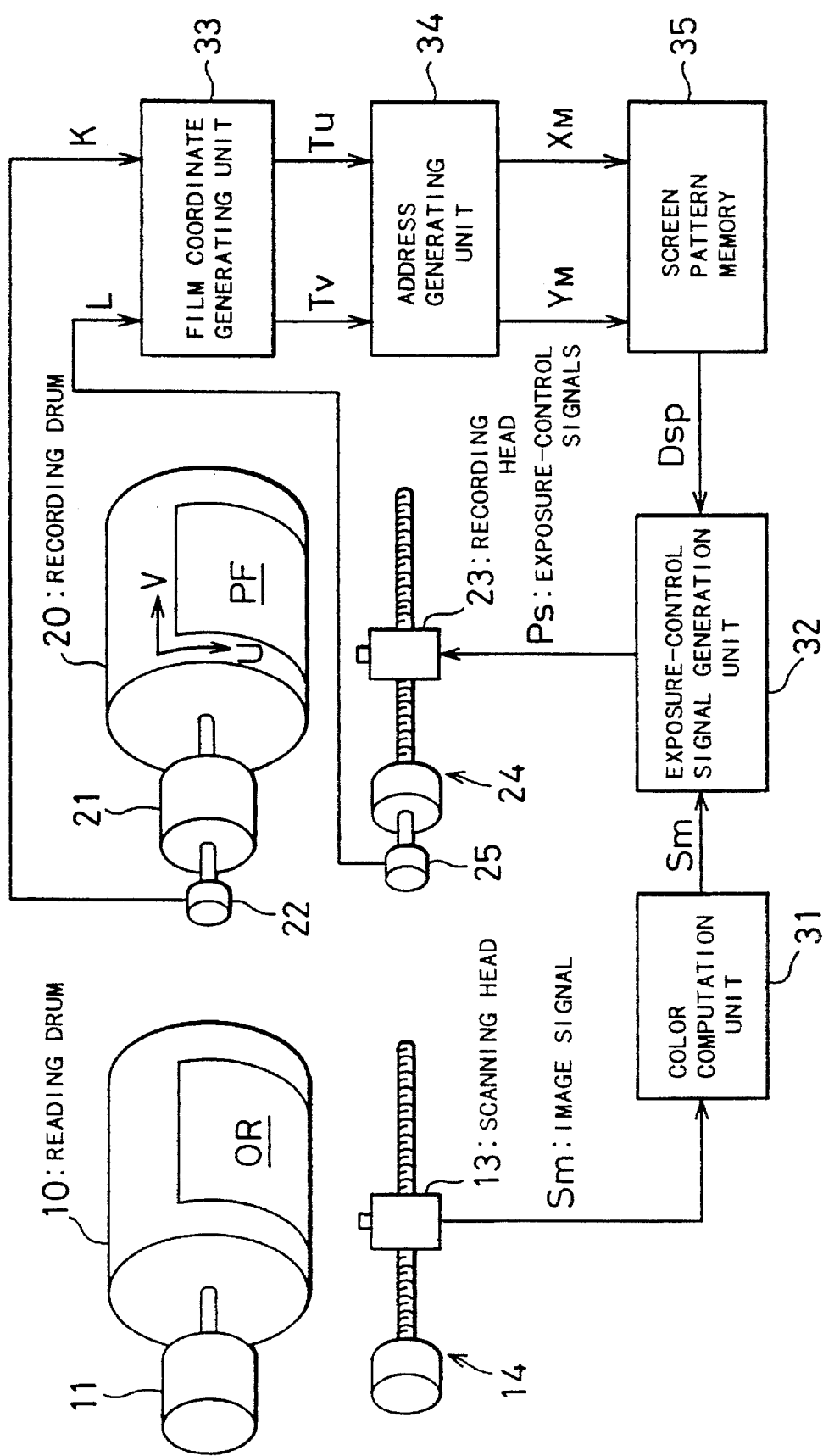
FIG. 8 is a view schematically illustrating the structure of an image recording apparatus embodying the present invention.

FIG. 8 is a view conceptually illustrating the structure of a halftone image recording apparatus embodying the present invention. The image recording apparatus includes a reading drum 10 and a recording drum 20. An original OR is mounted on the reading drum 10, and a photosensitive film PF is mounted on the recording drum 20.

The reading drum 10 is driven by a motor 11 to rotate at a predetermined speed while a scanning head 13 is driven by a feeding mechanism 14 with a ball thread to move at a constant speed in parallel to a central axis of the reading drum 10. The scanning head 13 successively scans the original OR with respect to each scanning line to capture an image signal Sm. The image signal Sm is supplied to a color computation unit 31, where color correction and tone correction are executed, to be then supplied to an exposure control signal generation unit 32.

The recording drum 20 is driven by a motor 21 to rotate at a predetermined speed while a recording head 23 is driven by a feeding mechanism 24 with a ball thread to move at a constant speed in parallel to a central axis of the recording drum 20. A rotary encoder 22 rotating with the recording drum 20 generates a clock signal K for a primary scanning direction whereas another rotary encoder 25 rotating in response to a rotation of a motor of the feeding mechanism 24 generates a clock signal L for a secondary scanning direction.

Figure 9:
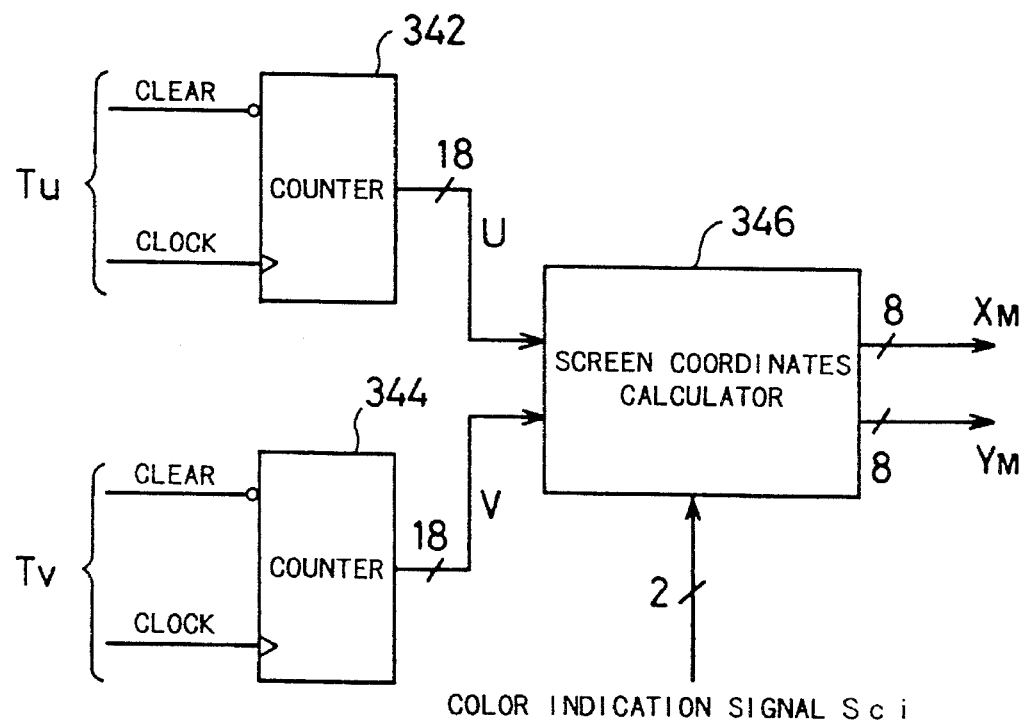
FIG. 9 is a block diagram showing the internal structure of an address generating unit used in Irrational Tangent Method.

A film coordinate generating unit 33 converts the clock signals K and L to clock signals Tu and Tv indicating positions of recording pixels on the photosensitive film PF. The converted clock signals Tu and Tv are then supplied to an address generating unit The address generating unit 34 obtains the address $X_M$, $Y_M$ of the screen pattern memory as a function of the clock signals Tu and Tv according to the above equations (1), (2), (3) and (4). FIG. 9 is a block diagram showing the internal structure of the address generating unit 34. The address generating unit 34 includes two binary counters 342 and 344 and a screen coordinates calculator 346. The binary counters 342 and 344 respectively count the clock signals Tu and Tv to output the count values as coordinates (U, V) in the scanning coordinates system. The screen coordinates calculator 346 converts the coordinates (U, V) to the screen pattern coordinates (X, Y) according to the equations (1) and (2), and further outputs the address ($X_M$, $Y_M$) according to the equations (3) and (4).

The address generating unit 34 is implementing the Irrational Tangent Method. In recording halftone images by the Irrational Tangent Method, the same screen pattern data is applied to all colors, but different screen angles are allocated to respective colors. The screen coordinates calculator 346 sets the screen angle $\theta$ at a predetermined value responsive to a color indication signal Sci, which is a two-bit signal for specifying one of the four primary colors, and executes the above coordinates conversion.

The coordinates (X, Y) determined by the address generating unit 34 are supplied to a screen pattern memory 35. Screen pattern data Dsp stored at the address ($X_M$, $Y_M$) is read out of the screen pattern memory 35 accordingly, to be supplied to the exposure control signal generation unit 32 (FIG. 8). The screen pattern data Dsp are, for example, those shown in FIG. 5A.

The exposure control signal generation unit 32 compares the image signal Sm with the screen pattern data Dsp, thereby generating a binary exposure control signal Ps representing whether or not to expose each recording pixel. The exposure control signal Ps has an H level for pixels where Dsp is less than Sm, and an L level for pixels where Dsp is not less than Sm. The recording head 23 on-off controls exposure beams responsive to the exposure control signals Ps, thereby recording halftone images on the photosensitive film PF. The dot positions in the M, C, and K plates are determined such that the halftone images overlaid one after another will make the halftone dot arrangement shown in FIG. 1B.

D. Dot Generation by Rational Tangent Method

Rational Tangent Method can be also applicable to the present invention. In the Rational Tangent Method, a tangent of a screen angle $\theta$ (tan $\theta$) is set to be a rational number.

Figure 10:
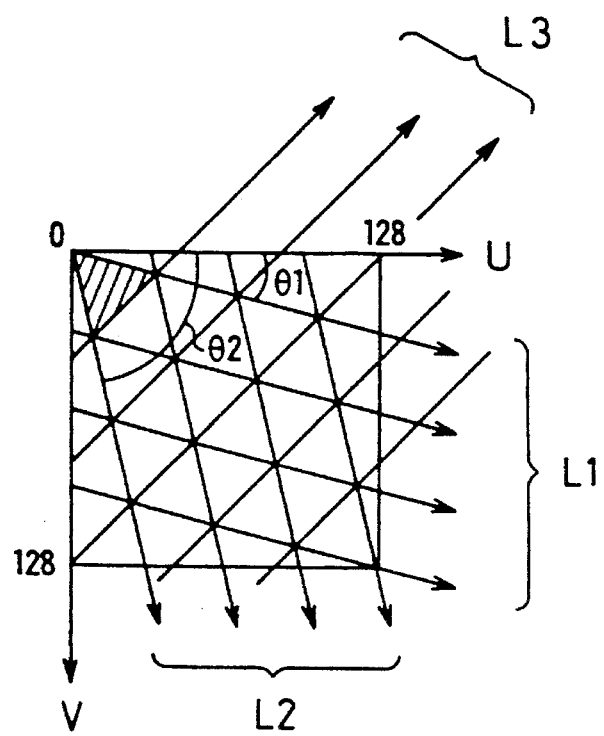
FIG. 10 shows determination of a halftone dot arrangement in Rational Tangent Method in a second embodiment of the present invention.
Figure 11:
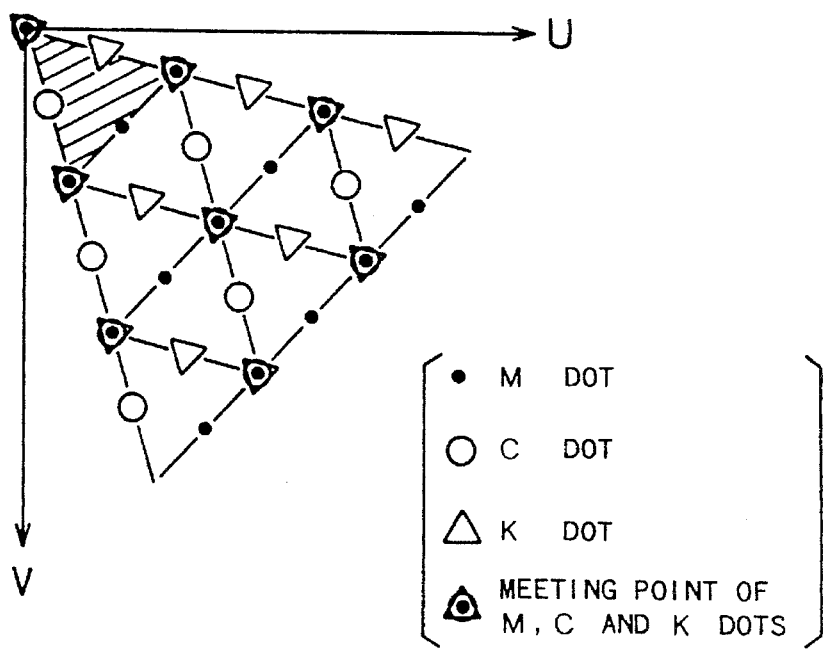
FIG. 11 shows a resulting halftone dot arrangement of M, C, and K color printing plates in the second embodiment.

FIG. 10 schematically illustrates a halftone dot arrangement in the Rational Tangent Method. A first group of parallel lines L1 are set at a first screen angle θ1 whose tangent (tan θ1) is equal to one fourth while a second group of parallel lines L2 are set at a second screen angle θ2 whose tangent (tan θ2) is four. The first group of parallel lines L1 have a pitch p (FIG. 1B), and so do the second group of parallel lines L2. A third group of parallel lines L3 are then drawn through intersections of the first and second group of parallel lines L1 and L2. A triangle, which is shaded in FIG. 10, defined by the three groups of parallel lines L1, L2 and L3 is used in place of the equilateral triangle shown in FIG. 1A. A vertical angle of the triangle is about 62 degrees whereas the other two angels are about 59 degrees, respectively. FIG. 11 shows a resulting halftone dot arrangement of M, C, and K plates according to the principle of FIG. 10.

Figure 12A:
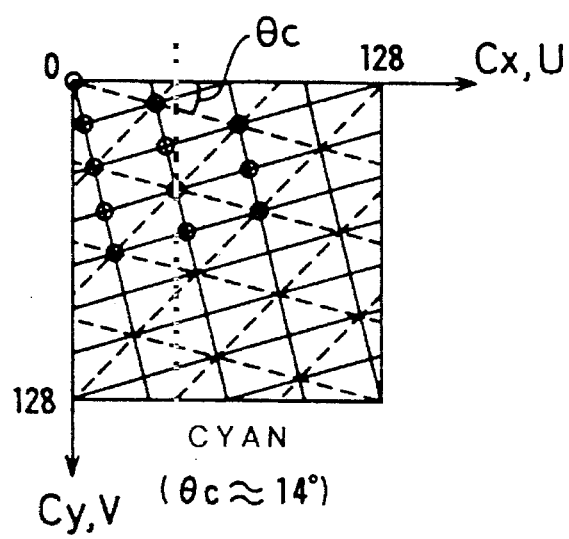
FIGS. 12A through 12D respectively show a halftone dot arrangement of each color printing plate in the second embodiment.
Figure 12B:
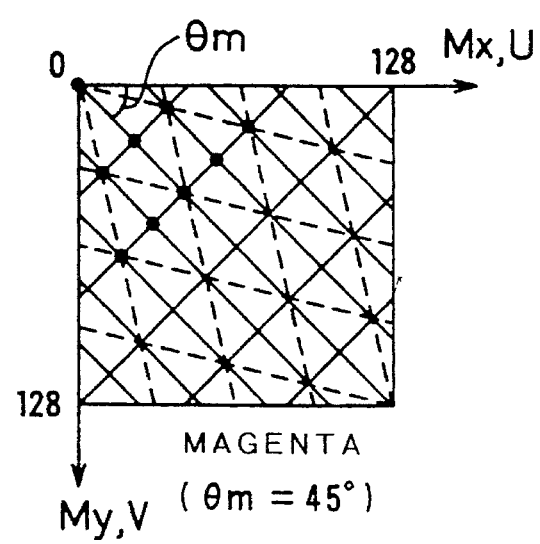
Figure 12C:
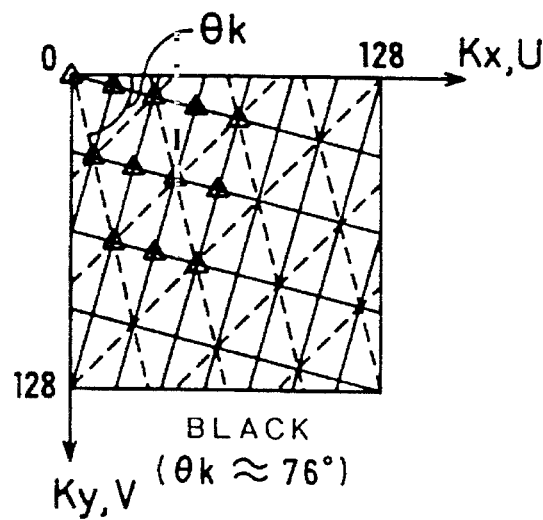
Figure 12D:
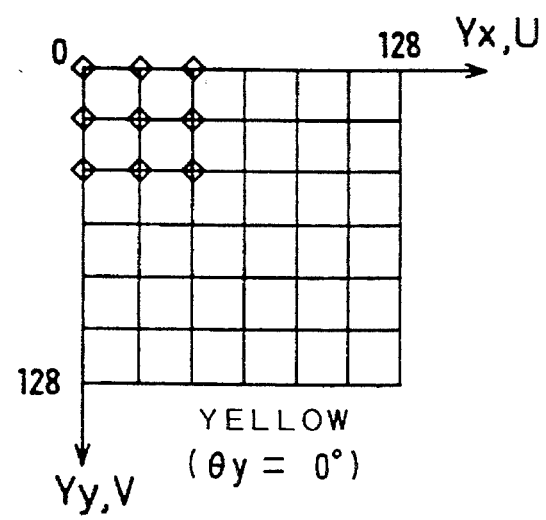

FIGS. 12A through 12D show the halftone dot arrangements of the color printing plates for cyan, magenta, black, and yellow, respectively, which constitute the resulting halftone dot arrangement of FIG. 11. Screen angles θc, θm, and θk for the C, M, and K plates are respectively set at about 14 degrees (tan θc=¼), 45 degrees (tan θm=½), and about 76 degrees (tan θk=4). Since the halftone image of the Y plate hardly contributes to occurrence of the rosette moire, its screen angle is set at zero degree and the size of its unit halftone dot area is set close to those of the other color plates. As shown in FIG. 12A, for example, directions of address coordinates Cx and Cy in the screen pattern coordinates system are coincident with directions of scanning coordinates U and V in the scanning coordinates system in the Rational Tangent Method. Screen pattern data therefore is prepared for each color plate. Since it is repeatedly applied to every 128×128 pixel area with respect to two direction of coordinates Cx and Cy, the screen pattern data corresponding to one 128×128 pixel area is stored in a screen pattern memory.

Figure 13:
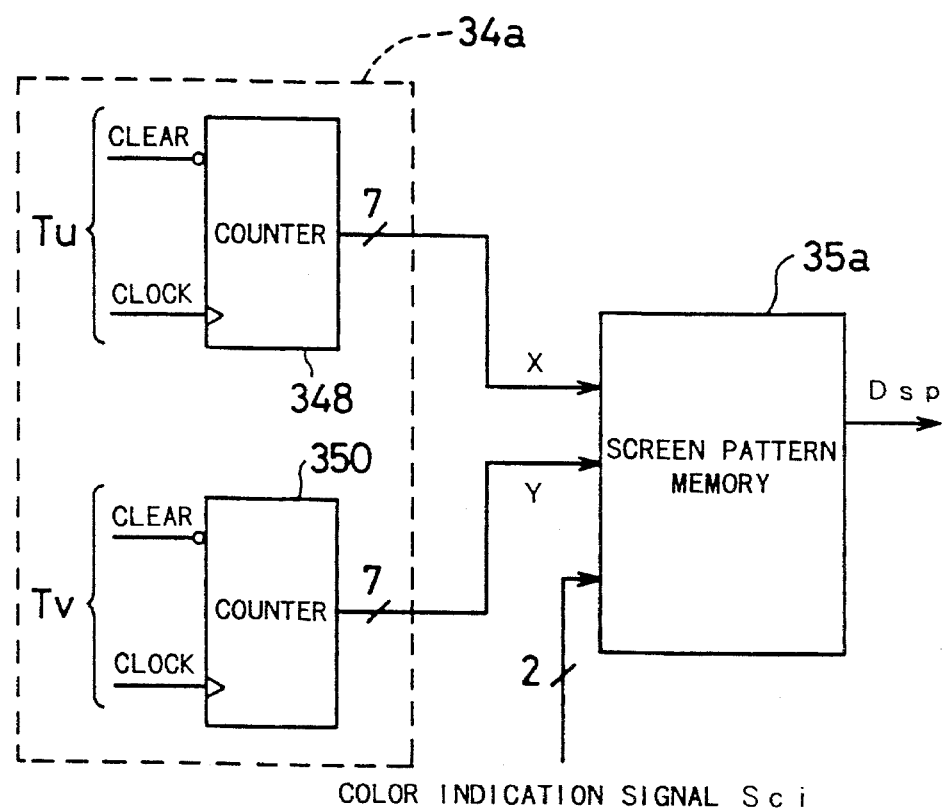
FIG. 13 is a block diagram showing the internal structure of an address generating unit used in Rational Tangent Method.

FIG. 13 is a block diagram showing the internal structure of an address generating unit and the screen pattern memory used in recording halftone images according to the Rational Tangent Method. An address generating unit 34a includes two binary counters 348 and 350. The two binary counters 348 and 350 respectively count clock signals Tu and Tv to output the count values as coordinates $(X_M, Y_M)$ in the screen pattern coordinates system, and reset the count value when the count value reaches 128. A screen pattern memory 35a receives the coordinates $(X_M, Y_M)$ as an address as well as the color indication signal Sci. In the Rational Tangent Method, the screen pattern memory 35a stores screen pattern data prepared for each color plate, and screen pattern data for one color plate is read out of the screen pattern memory 35a responsive to the color indication signal Sci.

E. Other Embodiments

Although the reference triangle is an equilateral triangle or an isosceles triangle close to the equilateral triangle in the above embodiments, the shape of the reference triangle is not limited to those in the above embodiments.

Figure 14A:
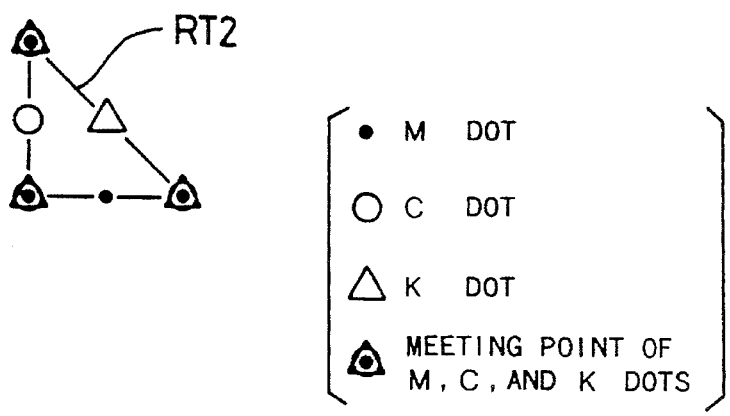
FIGS. 14A and 14B show a halftone dot arrangement with an isosceles right-angled reference triangle according to a third embodiment of the present invention.
Figure 14B:
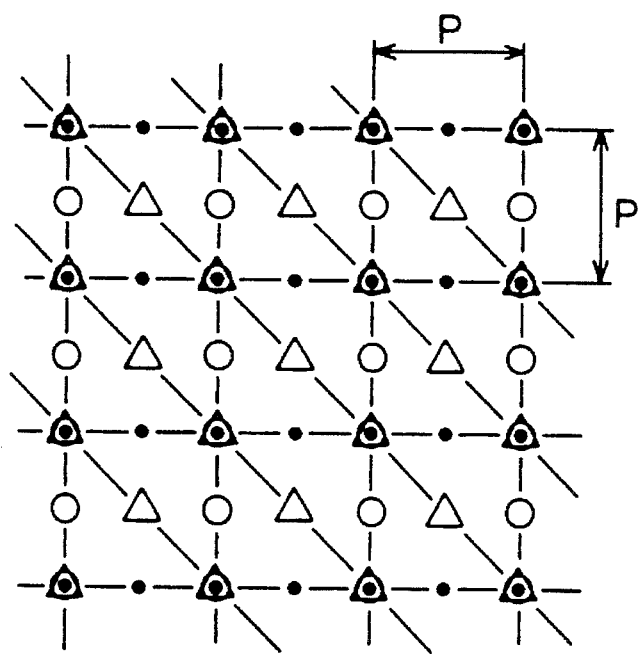

FIGS. 14A and 14B show a halftone dot arrangement with a reference triangle of an isosceles right-angled triangle. As shown in FIG. 14A, a reference triangle RT2 has three apexes, which are meeting points of halftone dots of three different colors M, C, and K. The M, C, and K dots are also positioned at middle points of three sides of the reference triangle RT2, respectively. This arrangement follows the same principle as that of FIG. 1. FIG. 14B shows the halftone dot arrangement formed by repeating the reference triangle RT2. The meeting points are located at square lattice points in the arrangement of FIG. 14B whereas the arrangement of FIG. 1B has the meeting points at triangular lattice points.

Figures 2, 15A:
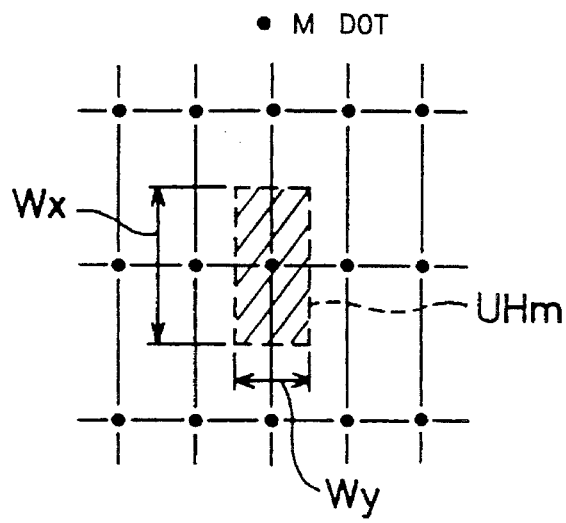
Figures 1, 15B:
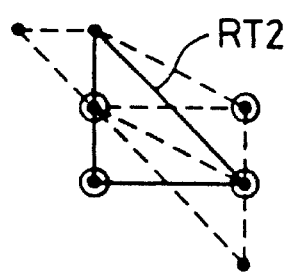
Figures 2, 15B:
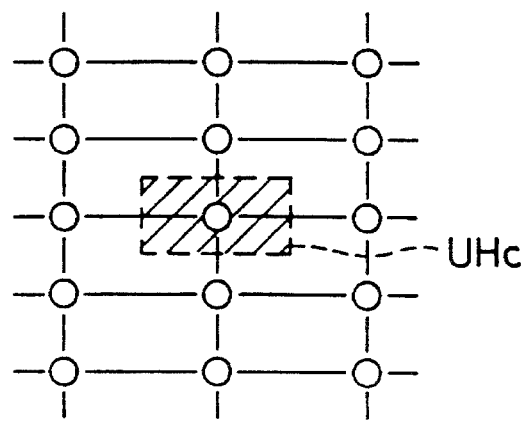
Figures 1, 15C:
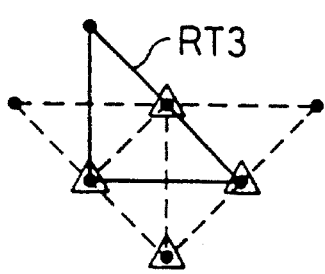
Figures 2, 15C:
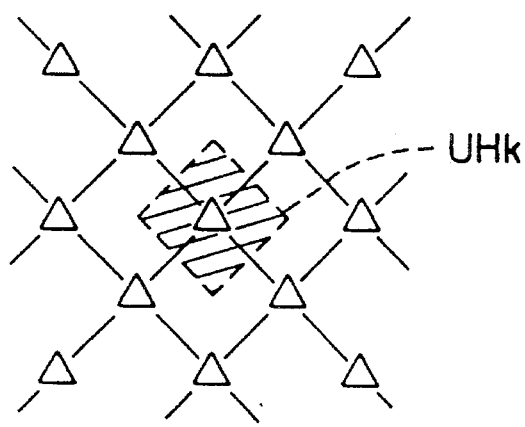
Figure 16A:
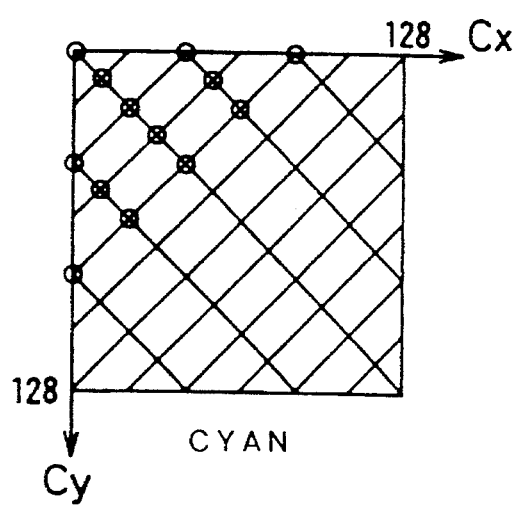
FIGS. 16A through 16D respectively show a halftone dot arrangement of each color printing plate inclined at 45 degrees.
Figure 16B:
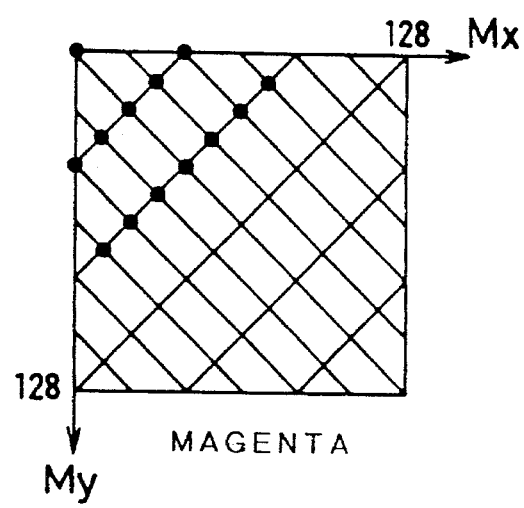
Figure 16C:
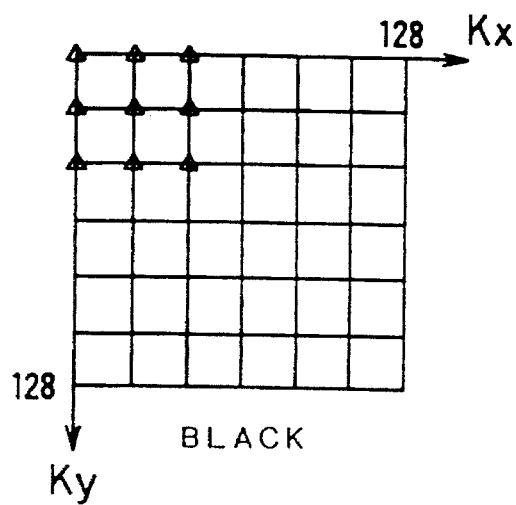
Figure 16D:
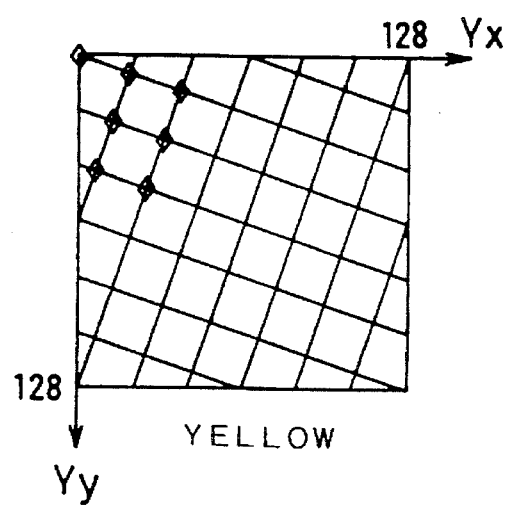

FIGS. 15A-1 through 15C-2 respectively show parallelograms and a unit halftone dot area of a halftone dot arrangement of each color plate, which are formed with the reference triangle RT2. The parallelograms closest to a square are respectively selected among a plurality of parallelograms as unit halftone dot areas UHm, UHc, and UHk, respectively, as shown in FIG. 15A-1, 15B-1, and 15C-1. A length Wx of a longer side of the unit halftone dot area UHm for magenta, which is shown in FIG. 15A-2, is twice as long as a length Wy of its shorter side. The length Wx is equal to the pitch P of the meeting points shown in FIG. 14B. In this embodiment, since the unit halftone dot areas UHm, UHc, and UHk of the three color plates have the same size, the substantial screen rulings thereof are equal to one another.

Suppose that the size of the unit halftone dot area shown in FIG. 15 is made equal to the size of the unit halftone dot area for cyan shown in FIG. 18. In this case, the pitch P of the repeated pattern of FIG. 14B is approximately 0.63 times the pitch Prm of rosette moire shown in FIG. 18, and a spatial frequency of FIG. 14B is approximately 1.6 times that of FIG. 18. The smaller pitch P of the repeated pattern in FIG. 14B makes the repeated pattern inconspicuous to the naked eyes.

In order to make the meeting points of FIG. 14B further inconspicuous, it is preferable to make each halftone dot pattern inclined at a predetermined angle (for example, 45 degrees) from the position shown in FIG. 14B. FIGS. 16A through 16D respectively show a halftone dot arrangement of each color plate inclined at 45 degrees from the position of FIG. 14B. These halftone dot arrangements, which correspond to those of FIGS. 12A through 12D, are formed according to the Rational Tangent Method. Since the halftone image of the Y plate hardly contributes to occurrence of rosette moire, Y dots are arranged to make the size of its unit halftone dot area substantially equal to those of the other halftone plates.

Figure 17A:
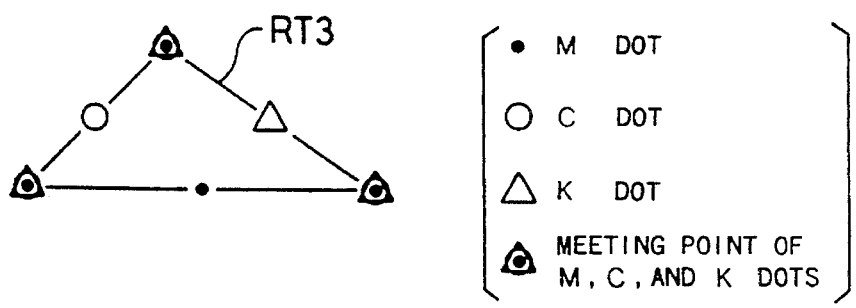
FIGS. 17A and 17B show a halftone dot arrangement with a reference triangle of another desirable shape.
Figure 17B:
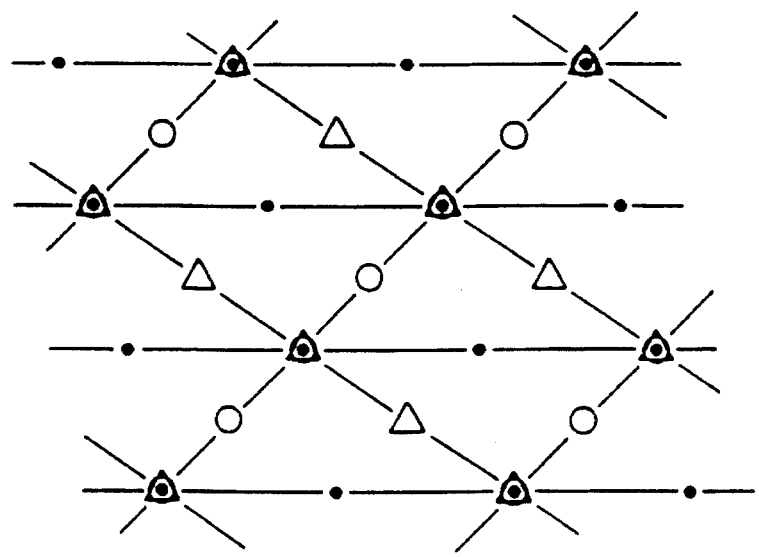

FIG. 17A shows a reference triangle RT3 of a desirable shape other than an equilateral or isosceles triangle. FIG. 17B illustrates a halftone dot arrangement formed with the reference triangle RT3. The halftone dot arrangements are determined according to the same principle as the above embodiments. That is, one parallelogram is selected out of a plurality of parallelograms which can be formed from three apexes of an arbitrary apex of the reference triangle RT3, a middle point of a side of the reference triangle RT3 facing to the arbitrary apex, and one of the other apexes of the reference triangle RT3. The selected parallelogram is repeated on an image plane, and the halftone dots are located at the apexes of the selected parallelogram. The selected parallelogram is determined as a unit halftone dot are, and it is preferable to select the parallelogram closest to a square as a unit halftone dot area. In this embodiment, the pitch of the repeated pattern or that of the meeting points is substantially equal to the pitch of the halftone dots, thus effectively preventing occurrence of rosette moire.

Since the invention may be embodied in other forms without departing from the scope or spirit of essential characteristics thereof, it is clearly understood that the above embodiment is only illustrative and not restrictive in any sense. The spirit and scope of the present invention is limited only by the terms of the appended claims.

What is claimed is:

1. A method of recording a plurality of color separation images of a color image as halftone images, said method comprising the steps of:

(a) presetting a reference triangle having a first apex, a second apex, a third apex, a first side facing to said first apex, a second side facing to said second apex, and a third side facing to said third apex;
(b) producing a first halftone image with the steps of:
  (b-1) selecting a first parallelogram out of a first set of a plurality of parallelograms which are formed from three apexes consisting of said first apex, a first middle point of said first side, and one of said second and third apexes;
  (b-2) virtually laying out said first parallelogram as a first unit area repeatedly over a first image plane; and
  (b-3) locating one halftone dot with respect to each said first unit area;
(c) producing a second halftone image with the steps of:
  (c-1) selecting a second parallelogram out of a second set of a plurality of parallelograms which are formed from three apexes consisting of said second apex, a second middle point of said second side, and one of said first and third apexes;
  (c-2) virtually laying out said second parallelogram as a second unit area repeatedly over a second image plane; and
  (c-3) locating one halftone dot with respect to each said second unit area; and
(d) producing a third halftone image with the steps of:
  (d-1) selecting a third parallelogram out of a third set of a plurality of parallelograms which are formed from three apexes consisting of said third apex, a third middle point of said third side, and one of said first and second apexes;
  (d-2) virtually laying out said third parallelogram as a third unit area repeatedly over a third image plane; and
  (d-3) locating one halftone dot with respect to each said third unit area.

2. A method in accordance with claim 1, wherein said step (b-1) includes the step of selecting said first parallelogram whose angles are closest to a right angle among said first set of said plurality of parallelograms;

said step (c-1) includes the step of selecting said second parallelogram whose angles are closest to a right angle among said second set of said plurality of parallelograms; and said step (d-1) includes the step of selecting said third parallelogram whose angles are closest to a right angle among said third set of said plurality of parallelograms.

3. A method in accordance with claim 1, wherein said step (b-3) includes the step of locating halftone dots at said first through third apexes and said first middle point;

said step (c-3) includes the step of locating halftone dots at said first through third apexes and said second middle point;

said step (d-3) includes the step of locating halftone dots at said first through third apexes and said third middle point.

4. A method in accordance with claim 1, wherein said reference triangle has three angles of substantially 60 degrees.

5. A method in accordance with claim 1, wherein said first through third halftone images are those for magenta, cyan, and black inks, respectively.

6. An apparatus of recording a plurality of color separation images for a plurality of colors as halftone images, comprising:

(a) image capturing means for capturing a plurality of color separation image signals representing a color image for at least three colors, respectively;

(b) a mount for mounting photosensitive material, on which a plurality of halftone images are to be recorded;

(c) a screen pattern memory for storing three sets of threshold values for said respective three colors, said three sets of threshold values being arranged in first through third unit areas, respectively, each of said first through third unit areas being laid out repeatedly in first through third X-Y coordinate systems, respectively, each of said first through third unit areas being defined by:
  (c-1) presetting a reference triangle having a first apex, a second apex, a third apex, a first side facing to said first apex, a second side facing to said second apex, and a third side facing to said third apex;
  (c-2) selecting a first parallelogram as said first unit area out of a first set of a plurality of parallelograms which are formed from three apexes consisting of said first apex, a first middle point of said first side, and one of said second and third apexes, the sides of said first parallelogram being parallel to the coordinate axes of said first X-Y coordinate system;
  (c-3) selecting a second parallelogram as said second unit area out of a second set of a plurality of parallelograms which are formed from three apexes consisting of said second apex, a second middle point of said second side, and one of said first and third apexes, the sides of said second parallelogram being parallel to the coordinate axes of said second X-Y coordinate system; and
  (c-4) selecting a third parallelogram as said third unit area out of a third set of a plurality of parallelograms which are formed from three apexes consisting of said third apex, a third middle point of said third side, and one of said first and second apexes, the sides of said third parallelogram being parallel to the coordinate axes of said third X-Y coordinate system;

(d) coordinate signal generation means for generating a coordinate signal representing a position in a Cartesian U-V coordinate system, said U and V denoting a primary scanning direction and a secondary scanning direction on said mount, respectively, said U-V coordinate system being set in predetermined relations to said first through third X-Y coordinate systems;

(e) address generation means for transforming said coordinate signal from U-V coordinates into first through third X-Y coordinates to generate address for said screen pattern memory;

(f) comparator means for comparing each of said plurality of color separation image signals with a target threshold value read out from each of said three sets of threshold values stored in said screen pattern memory as a function of said first through third X-Y coordinates, to thereby generate a plurality of exposure signals for said respective three colors, said plurality of exposure signals indicating whether or not to expose target recording pixels on said photosensitive material; and (g) exposure means for exposing said photosensitive material mounted on said drum responsive to each of said plurality of exposure signals, thereby recording said plurality of color separation images for said three colors as halftone images.

7. An apparatus in accordance with claim 6, wherein said first parallelogram are one whose angles are closest to a right angle among said first set of said plurality of parallelograms;

said second parallelogram are one whose angles are closest to a right angle among said second set of said plurality of parallelograms; and said third parallelogram are one whose angles are closest to a right angle among said third set of said plurality of parallelograms.

8. An apparatus in accordance with claim 6, wherein halftone dots for a first color of said three colors are located at said first through third apexes and said first middle point;

halftone dots for a second color of said three colors are located at said first through third apexes and said second middle point; and halftone dots for a third color of said three colors are located at said first through third apexes and said third middle point.

9. An apparatus in accordance with claim 6, wherein said reference triangle has three angles of substantially 60 degrees.

10. An apparatus in accordance with claim 6, wherein said three colors are magenta, cyan, and black.

11. An apparatus in accordance with claim 6, wherein said first through third X-Y coordinate systems are Cartesian coordinate systems.

12. An apparatus of recording a plurality of color separation images for a plurality of colors as halftone images, comprising:

(a) image capturing means for capturing a plurality of color separation image signals representing a color image for at least three colors, respectively;

(b) a mount for mounting photosensitive material, on which a plurality of halftone images are to be recorded;

(c) a screen pattern memory for storing three sets of threshold values for said respective three colors, said three sets of threshold values being arranged in first through third block areas, respectively, said first through third block areas including a plurality of first unit areas, a plurality of second unit areas, and a plurality of third unit areas, respectively, each of said first through third block areas being laid out repeatedly in an X-Y coordinate system, each of said first through third unit areas being defined by:

(c-1) presetting a reference triangle having a first apex, a second apex, a third apex, a first side facing to said first apex, a second side facing to said second apex, and a third side facing to said third apex;

(c-2) selecting a first parallelogram as said first unit area out of a first set of a plurality of parallelograms which are formed from three apexes consisting of said first apex, a first middle point of said first side, and one of said second and third apexes;

(c-3) selecting a second parallelogram as said second unit area out of a second set of a plurality of parallelograms which are formed from three apexes consisting of said second apex, a second middle point of said second side, and one of said first and third apexes; and (c-4) selecting a third parallelogram as said third unit area out of a third set of a plurality of parallelograms which are formed from three apexes consisting of said third apex, a third middle point of said third side, and one of said first and second apexes;

(d) coordinate signal generation means for generating a coordinate signal representing a position in a Cartesian U-V coordinate system, said U and V denoting a primary scanning direction and a secondary scanning direction on said mount, respectively, said U-V coordinate system being set in predetermined relation to said X-Y coordinate system;

(e) address generation means for transforming said coordinate signal from said U-V coordinates into said X-Y coordinates to generate an address for said screen pattern memory;

(f) comparator means for comparing each of said plurality of color separation image signals with a target threshold value read out from each of said three sets of threshold values stored in said screen pattern memory as a function of said corrected X-Y coordinates, to thereby generate a plurality of exposure signals for said respective three colors, said plurality of exposure signals indicating whether or not to expose target recording pixels on said photosensitive material; and (g) exposure means for exposing said photosensitive material mounted on said drum responsive to each of said plurality of exposure signals, thereby recording said plurality of color separation images for said three colors as halftone images.

13. An apparatus in accordance with claim 12, wherein said first parallelogram are one whose angles are closest to a right angle among said first set of said plurality of parallelograms;

said second parallelogram are one whose angles are closest to a right angle among said second set of said plurality of parallelograms; and said third parallelogram are one whose angles are closest to a right angle among said third set of said plurality of parallelograms.

14. An apparatus in accordance with claim 12, wherein halftone dots for a first color of said three colors are located at said first through third apexes and said first middle point;

halftone dots for a second color of said three colors are located at said first through third apexes and said second middle point; and halftone dots for a third color of said three colors are located at said first through third apexes and said third middle point.

15. An apparatus in accordance with claim 12, wherein said reference triangle has three angles of substantially 60 degrees.

16. An apparatus in accordance with claim 12, wherein said three colors are magenta, cyan, and black.

17. An apparatus in accordance with claim 12, wherein said X-Y coordinate system is a Cartesian coordinate system.

* * * * *